US012602668B2

(12) United States Patent
Fu et al.

(10) Patent No.: US 12,602,668 B2
(45) Date of Patent: Apr. 14, 2026

(54) METHOD FOR GENERATING RECYCLING RECORD OF SOLAR PANEL AND RECYCLING SYSTEM IMPLEMENTING THE SAME

(71) Applicant: National University of Tainan, Tainan City (TW)

(72) Inventors: Yao-Hsien Fu, Kaohsiung City (TW); Chia-Tsung Hung, Tainan City (TW)

(73) Assignee: NATIONAL UNIVERSITY OF TAINAN, Tainan City (TW)

( * ) Notice: Subject to any disclaimer, the term of this patent is extended or adjusted under 35 U.S.C. 154(b) by 0 days.

(21) Appl. No.: 18/799,649

(22) Filed: Aug. 9, 2024

(65) Prior Publication Data

US 2025/0061428 A1      Feb. 20, 2025

(30) Foreign Application Priority Data

Aug. 17, 2023      (TW) .................................. 112130969

(51) Int. Cl.
| | |
|---|---|
| *G06Q 10/30* | (2023.01) |
| *B23P 19/04* | (2006.01) |
| *H10F 71/00* | (2025.01) |

(52) U.S. Cl.
CPC .............. *G06Q 10/30* (2013.01); *B23P 19/04* (2013.01); *H10F 71/00* (2025.01)

(58) Field of Classification Search
CPC .................................................... H10F 71/00
See application file for complete search history.

(56) References Cited

U.S. PATENT DOCUMENTS

| | | | | |
|---|---|---|---|---|
| 11,279,425 | B1 * | 3/2022 | Balzano ................. | B62D 65/00 |
| 2018/0133720 | A1 * | 5/2018 | Lee .......................... | B02C 23/30 |
| 2019/0017863 | A1 * | 1/2019 | Saltzman ............. | G06Q 20/065 |
| 2021/0213573 | A1 * | 7/2021 | Clark ...................... | C22B 1/005 |
| 2022/0052220 | A1 * | 2/2022 | Lai .......................... | H10F 77/211 |
| 2023/0185348 | A1 * | 6/2023 | Morrison ............. | G06F 1/1681 |
| | | | | 713/340 |

FOREIGN PATENT DOCUMENTS

| | | | | | |
|---|---|---|---|---|---|
| CN | 109092842 | A | * 12/2018 | ............... | B09B 5/00 |
| CN | 111177475 | A | * 5/2020 | ......... | G06F 16/2455 |
| CN | 115090645 | A | * 9/2022 | ............... | B09B 3/00 |
| CN | 115179022 | A | * 10/2022 | .............. | B23P 19/04 |

OTHER PUBLICATIONS

CN-111177475-A Translation (Year: 2020).*

* cited by examiner

*Primary Examiner* — Vincent M Cao
(74) *Attorney, Agent, or Firm* — Birch, Stewart, Kolasch & Birch, LLP

(57) ABSTRACT

A method for generating a recycling record of a solar panel is implemented by a computer that is connected to a dismantling equipment. The method includes: upon the dismantling equipment receiving the solar panel that is provided with an information element, controlling the dismantling equipment to capture the information element, and obtaining product information related to the solar panel based on the information element; controlling the dismantling equipment to dismantle the solar panel and to collect data of dismantling the solar panel; obtaining a recycling result based on the data of dismantling the solar panel; and generating and storing a recycling record that includes the product information and the recycling result as a block in a distributed ledger of a blockchain.

12 Claims, 4 Drawing Sheets

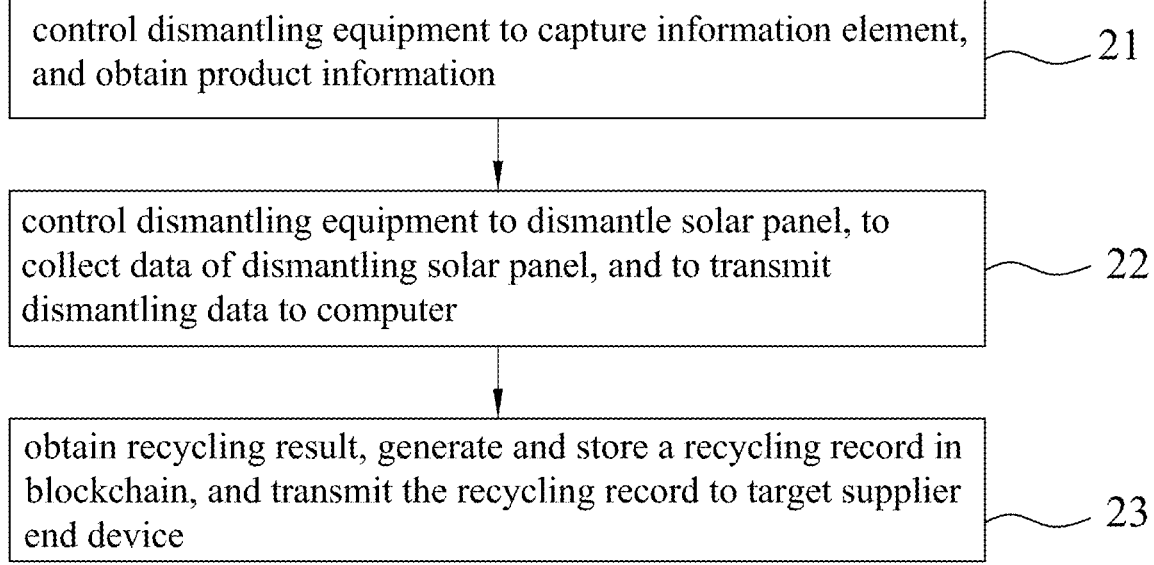

control dismantling equipment to capture information element, and obtain product information    ~21 control dismantling equipment to dismantle solar panel, to collect data of dismantling solar panel, and to transmit dismantling data to computer    ~22 obtain recycling result, generate and store a recycling record in blockchain, and transmit the recycling record to target supplier end device    ~23

FIG. 2

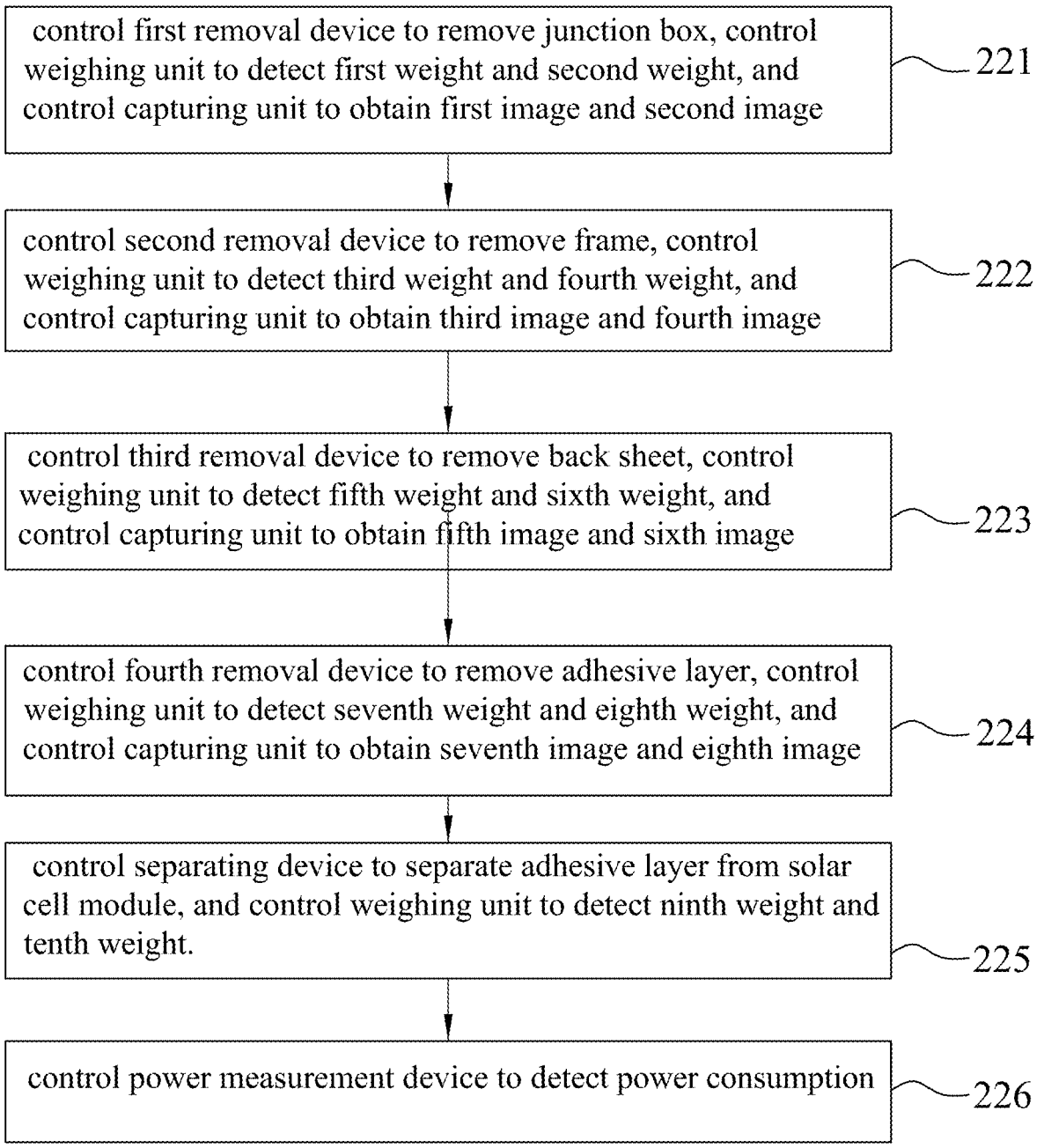

control first removal device to remove junction box, control weighing unit to detect first weight and second weight, and control capturing unit to obtain first image and second image ～221 control second removal device to remove frame, control weighing unit to detect third weight and fourth weight, and control capturing unit to obtain third image and fourth image ～222 control third removal device to remove back sheet, control weighing unit to detect fifth weight and sixth weight, and control capturing unit to obtain fifth image and sixth image ～223 control fourth removal device to remove adhesive layer, control weighing unit to detect seventh weight and eighth weight, and control capturing unit to obtain seventh image and eighth image ～224 control separating device to separate adhesive layer from solar cell module, and control weighing unit to detect ninth weight and tenth weight. ～225 control power measurement device to detect power consumption ～226

FIG. 3 obtain weights related to the solar panel, and calculate recycling ratio ~231 obtain a series of compressed images ~232 obtain location of dismantling equipment ~233 calculate carbon footprint generated by dismantling solar panel ~234 generate a recycling result ~235 generate and store a recycling record in blockchain ~236

METHOD FOR GENERATING RECYCLING RECORD OF SOLAR PANEL AND RECYCLING SYSTEM IMPLEMENTING THE SAME

CROSS-REFERENCE TO RELATED APPLICATION

This application claims priority to Taiwanese Invention Patent Application No. 112130969, filed on Aug. 17, 2023, the entire disclosure of which is incorporated by reference herein.

FIELD

The disclosure relates to a method for generating a recycling record and a recycling system implementing the same, and more particularly to a method for generating a recycling record of a solar panel and a recycling system implementing the same.

BACKGROUND

As fossil fuel resources are gradually depleted and the greenhouse effect intensifies, renewable energy has become a promising solution for saving the environment and revitalizing the economy. In some areas with sufficient sunlight, there is a continuous supply of solar energy which neither produces environmental pollution nor consumes the Earth's resources. Therefore, solar energy has become an indispensable part of the renewable energy industry.

However, solar panels that are discarded without proper treatments may be harmful to the environment. Silicon-based solar panels are made of glass, aluminum frames, batteries, etc., which are bonded together using EVA (ethylene-vinyl acetate) plastic. Solar panels may be recycled if properly dismantled and sorted; however, there is not yet a reliable and credible supervision mechanism for recycling solar panels.

SUMMARY

Therefore, an object of the disclosure is to provide a method for generating a recycling record of a solar panel, and a recycling system that can alleviate at least one of the drawbacks of the prior art.

According to an aspect of the disclosure, a method for generating a recycling record of a solar panel is implemented by a computer. The computer is connected to a peer-to-peer network, corresponds to a recycling operator, and is electrically connected to a dismantling equipment. The dismantling equipment is configured to obtain information related to the solar panel and to dismantle the solar panel. The method includes, upon the dismantling equipment receiving the solar panel that is provided with an information element, controlling the dismantling equipment to capture the information element, and obtaining product information related to the solar panel based on the information element. The method further includes controlling the dismantling equipment to dismantle the solar panel and to collect data of dismantling the solar panel; obtaining a recycling result based on the data of dismantling the solar panel; and generating and storing a recycling record that includes the product information and the recycling result as a block in a distributed ledger of a blockchain managed by the peer-to-peer network.

According to another aspect of the disclosure, a recycling system for generating a recycling record of a solar panel is provided. The recycling system is adapted to recycle a solar panel and includes a dismantling equipment and a computer. The dismantling equipment is configured to obtain information related to the solar panel and to dismantle the solar pane. The computer is connected to a peer-to-peer network, and is electrically connected to the dismantling equipment. The computer is configured to, upon the dismantling equipment receiving the solar panel that is provided with an information element, control the dismantling equipment to capture the information element, and obtain product information related to the solar panel based on the information element. The computer is further configured to control the dismantling equipment to dismantle the solar panel and to collect data of dismantling the solar panel, to obtain a recycling result based on the data of dismantling the solar panel, and to generate and store a recycling record that includes the product information and the recycling result as a block in a distributed ledger of a blockchain managed by the peer-to-peer network.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 2 is a flow chart illustrating a method for generating a recycling record of a solar panel according to an embodiment of the disclosure.

FIG. 3 is a flow chart illustrating sub-steps of collecting data of dismantling the solar panel according to an embodiment of the disclosure.

DETAILED DESCRIPTION

Figure 1:
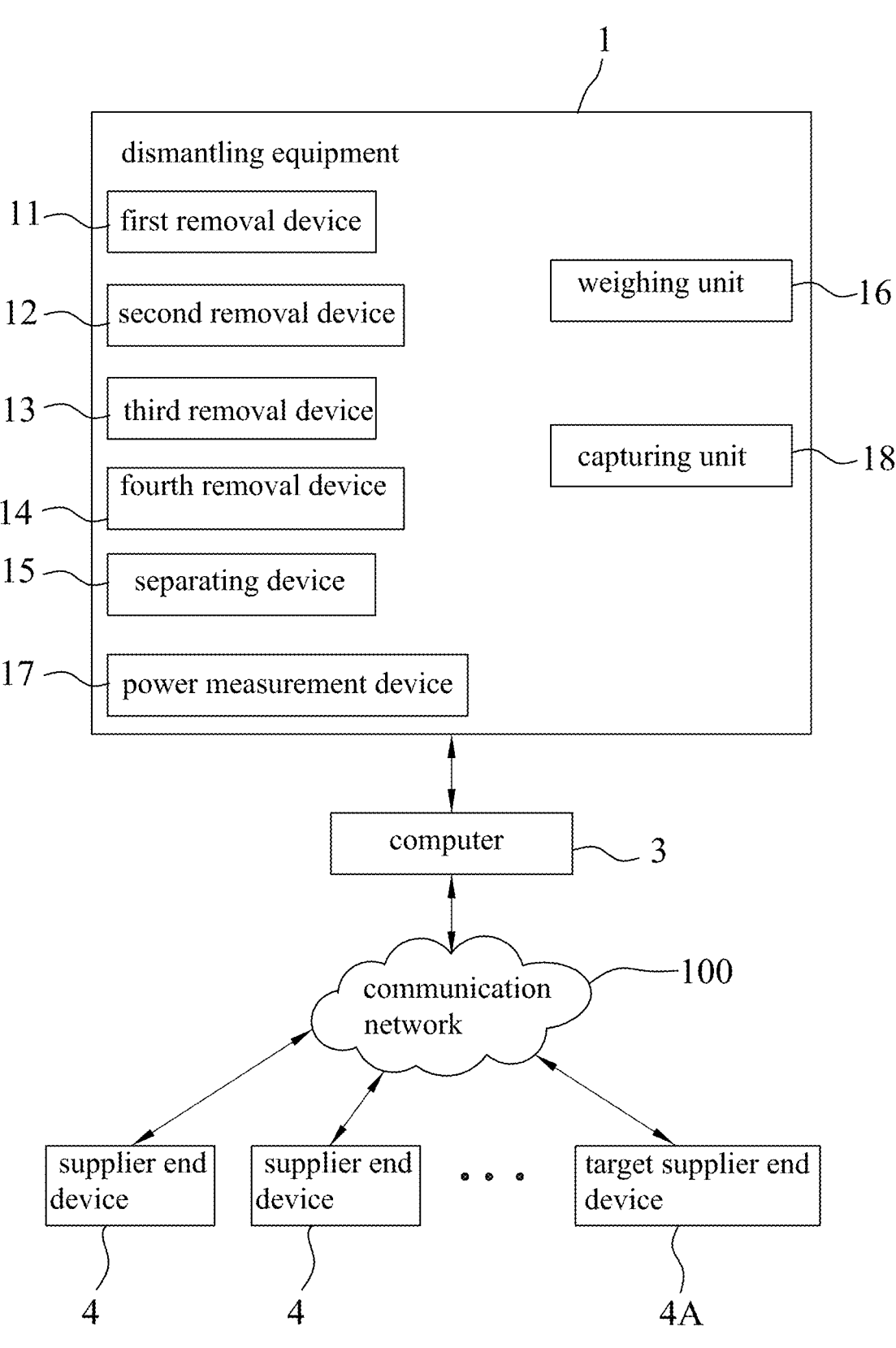
FIG. 1 is a block diagram illustrating a recycling system according to an embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a recycling system for generating a recycling record of a solar panel according to an embodiment of the disclosure is provided. The recycling system is adapted to recycle a solar panel (not shown), and is configured to communicate, through a communication network 100, with a plurality of supplier end devices 4 corresponding to a plurality of suppliers, where the solar panel may be provided by one of the suppliers. The recycling system includes a dismantling equipment 1, and a computer 3 that is electrically connected to the dismantling equipment 1. In this embodiment, the computer 3 is disposed in the dismantling equipment 1. In some embodiments, the computer 3 may be disposed separately from the dismantling equipment 1, but the disclosure is not limited to such. The computer 3 may be implemented as an industrial personal computer (IPC).

In practice, there may be a plurality of recycling systems corresponding to a plurality of recycling operators, where each of the recycling operators may hold more than one of the recycling systems. The computers 3 respectively of the recycling systems may be connected to each other to form a peer-to-peer network for managing a blockchain. That is to say, the computer 3 of each of the recycling systems is a node of a blockchain system that manages the blockchain. Since the recycling systems operate in a similar manner, only one recycling system is described in the following description, and the computer 3 of the recycling system corresponds to a recycling operator that holds the recycling system.

The dismantling equipment 1 is configured to dismantle the solar panel, and includes a first removal device 11, a second removal device 12, a third removal device 13, a fourth removal device 14, a separating device 15, a weighing unit 16, a power measurement device 17, and a capturing unit 18. The first removal device 11 is for removing a junction box of the solar panel, the second removal device 12 is for removing a frame of the solar panel, the third removal device 13 is for removing a back sheet of the solar panel, the fourth removal device 14 is for removing an adhesive layer and a solar cell module of the solar panel, the separating device 15 is for separating the adhesive layer from the solar cell module of the solar panel, the weighing unit 16 is for detecting a weight of the solar panel (or a portion of the solar panel) during a process of dismantling the solar panel, the power measurement device 17 is for detecting a power consumption of dismantling the solar panel, and the capturing unit 18 is for capturing an image of the solar panel (or a portion of the solar panel) during the process of dismantling the solar panel.

For details of the implementation of the first removal device 11, "the removing mechanism" disclosed in U.S. patent application Ser. No. 18/485,401 titled, "REMOVING DEVICE FOR REMOVING A JUNCTION BOX FROM A SOLAR CELL MODULE" may be referred to. For details of the implementation of the second removal device 12 and the third removal device 13, "the frame removal device" and "the back plate removal device" disclosed in U.S. Patent Application Publication No. US 2023/0236582 A1 titled, "METHOD FOR FACILITATING DISMANTLING A PHOTOVOLTAIC MODULE" may be referred to. For details of the implementation of the third removal device 13 and the fourth removal device 14, "the milling devices" disclosed in U.S. Patent Application Publication No. US 2024/0123479 A1 titled, "SOLAR CELL MODULE RECYCLING APPARATUS AND RECYCLING METHOD THEREFOR" may be referred to. For details of the implementation of the third removal device 13, the fourth removal device 14 and the separating device 15, "the fragmenting unit" and "the material-collecting and sorting device" disclosed in U.S. Patent Application Publication No. US 2024/0009893 A1 titled, "SYSTEM FOR PHYSICALLY DISMANTLING SOLAR CELL MODULE" may be referred to.

In this embodiment, the weighing unit 16 may be a scale that is configured to measure a weight of an object placed thereon, the power measurement device 17 may be a power meter that is configured to detect the power consumption of dismantling the solar panel (i.e., an amount of power consumed by the dismantling equipment 1 for dismantling the solar panel), and the capturing unit 18 may be a camera.

Referring further to FIG. 2, a flow of a method for generating a recycling record of a solar panel is implemented by the recycling system shown in FIG. 1, and includes steps 21 to 23.

In step 21, upon the dismantling equipment 1 receiving the solar panel that is provided with an information element, the computer 3 that is electrically connected to the recycling system controls the dismantling equipment 1 to capture the information element, and then obtains product information related to the solar panel based on the information element. It should be noted that the information element of the solar panel may be in various forms depending on a specification of the solar panel or a location where the solar panel is sold. For example, the information element may be in the form of a text, an image, a digital watermark, a 1-dimensional (1D) barcode, a 2D barcode, a 3D barcode, or a combination thereof, but the disclosure is not limited to such.

In this embodiment, the computer 3 controls the capturing unit 18 of the dismantling equipment 1 to capture an image of the information element, and then obtains the product information that is related to the solar panel (e.g., supplier end information, manufacturer, product number, power output, certification authority, size, weight, etc.) from the information element by performing text recognition (e.g., optical character recognition) or image recognition on the information element. However, the weight of the solar panel may also be obtained using the weighing unit 16 of the dismantling equipment 1 when the solar panel is placed into the dismantling equipment 1. When the solar panel is shipped out from the factory, the manufacturer, the product number, the product power, the certification authority, the size and the weight of the solar panel may be directly printed on a location on the solar panel that is easy to be identified. The supplier end information of the solar panel is related to the supplier that provides the solar panel (hereinafter referred to as "target supplier"). When the solar panel is transported to the recycling system by the target supplier for recycling, the recycling operator of the recycling system may print a barcode (e.g., a 1D barcode, a 2D barcode, a 3D barcode, or a combination thereof) that encodes the supplier end information related to the target supplier, and attach the barcode, which encodes the supplier end information, to a location on the solar panel that is easy to be identified.

Additionally, after the solar panel that is provided with the information element is placed into the dismantling equipment 1, the recycling operator may control the dismantling equipment 1 to generate and send a recycling request to the computer 3 so that the computer 3 controls the dismantling equipment 1 to capture the image of the information element from the solar panel. In some embodiments, an operator end device is connected to the computer 3 through the communication network 100, and the recycling operator may control the operator end device to generate and send the recycling request to the computer 3, but the disclosure is not limited to such.

In step 22, the computer 3 controls the dismantling equipment 1 to dismantle the solar panel, to collect data of dismantling the solar panel (hereinafter referred to as "dismantling data"), and to transmit the dismantling data thus collected to the computer 3. Specifically, the dismantling data is related to the solar panel during the process of dismantling the solar panel. Referring further to FIG. 3, step 22 includes sub-steps 221 to 226.

In sub-step 221, the computer 3 controls the first removal device 11 to remove the junction box of the solar panel, and controls the weighing unit 16 to detect a first weight before removing the junction box (which is equal to the weight of the solar panel), and a second weight after removing the junction box (i.e., a weight of the solar panel without the junction box). The computer 3 further controls the capturing unit 18 to obtain a first image of the solar panel taken before removing the junction box (which resembles the solar panel before being dismantled), and a second image taken after removing the junction box (i.e., an image of the solar panel without the junction box). That is to say, the dismantling data collected by the dismantling equipment 1 includes the first weight, the second weight, the first image and the second image.

It should be noted that, in the following, weights and images are obtain in a similar manner as in sub-step 221, and descriptions such as "before removing" and "after removing" refer specifically to a state of the solar panel and will not be described in further detail for the sake of brevity.

In sub-step 222, the computer 3 controls the second removal device 12 to remove the frame of the solar panel, and controls the weighing unit 16 to detect a third weight before removing the frame (which is substantially equal to the second weight), and a fourth weight after removing the frame. The computer 3 further controls the capturing unit 18 to obtain a third image of the solar panel taken before removing the frame (which is substantially the same as the second image), and a fourth image taken after removing the frame. That is to say, the dismantling data collected by the dismantling equipment 1 further includes the third weight, the fourth weight, the third image and the fourth image.

In sub-step 223, the computer 3 controls the third removal device 13 to remove the back sheet of the solar panel, and controls the weighing unit 16 to detect a fifth weight before removing the back sheet (which is substantially equal to the fourth weight), and a sixth weight after removing the back sheet. The computer 3 further controls the capturing unit 18 to obtain a fifth image of the solar panel taken before removing the back sheet (which is substantially the same as the fourth image), and a sixth image taken after removing the back sheet. That is to say, the dismantling data collected by the dismantling equipment 1 further includes the fifth weight, the sixth weight, the fifth image and the sixth image.

In sub-step 224, the computer 3 controls the fourth removal device 14 to remove the adhesive layer and the solar cell module of the solar panel together, and controls the weighing unit 16 to detect a seventh weight before removing the adhesive layer and the solar cell module (which is substantially equal to the sixth weight), and an eighth weight after removing both of the adhesive layer and the solar cell module. The computer 3 further controls the capturing unit 18 to obtain a seventh image of the solar panel taken before removing the adhesive layer and the solar cell module (which is substantially the same as the sixth image), and an eighth image taken after removing both of the adhesive layer and the solar cell module. That is to say, the dismantling data collected by the dismantling equipment 1 further includes the seventh weight, the eighth weight, the seventh image and the eighth image.

In sub-step 225, the computer 3 controls the separating device 15 to separate the adhesive layer from the solar cell module of the solar panel, and controls the weighing unit 16 to detect a ninth weight of the adhesive layer and a tenth weight of the solar cell module. That is to say, the dismantling data collected by the dismantling equipment 1 further includes the ninth weight and the tenth weight. In this embodiment, in sub-step 225, the solar panel with both the adhesive layer and the solar cell module removed remains on a primary scale of the weighting unit 16, and the adhesive layer and the solar cell module are respectively placed on two secondary scales of the weighting unit 16 by the separating device 15, where the ninth weight and the tenth weight are detected by the two secondary scales respectively.

In sub-step 226, the computer 3 controls the power measurement device 17 to detect the power consumption of dismantling the solar panel. That is to say, the dismantling data collected by the dismantling equipment 1 further includes the power consumption.

To sum up, in step 22, the dismantling data collected by the dismantling equipment 1 includes the first to tenth weights, the first to eighth images, and the power consumption.

In step 23, the computer 3 obtains a recycling result based on the dismantling data, and then generates and stores a recycling record that includes both of the product information and the recycling result as a block in a distributed ledger of the blockchain managed by the peer-to-peer network. The computer 3 further transmits the recycling record to one of the supplier end devices 4 that corresponds to the target supplier (hereinafter referred to as "target supplier end device 4A") based on the supplier end information that is related to the target supplier.

Figure 4:
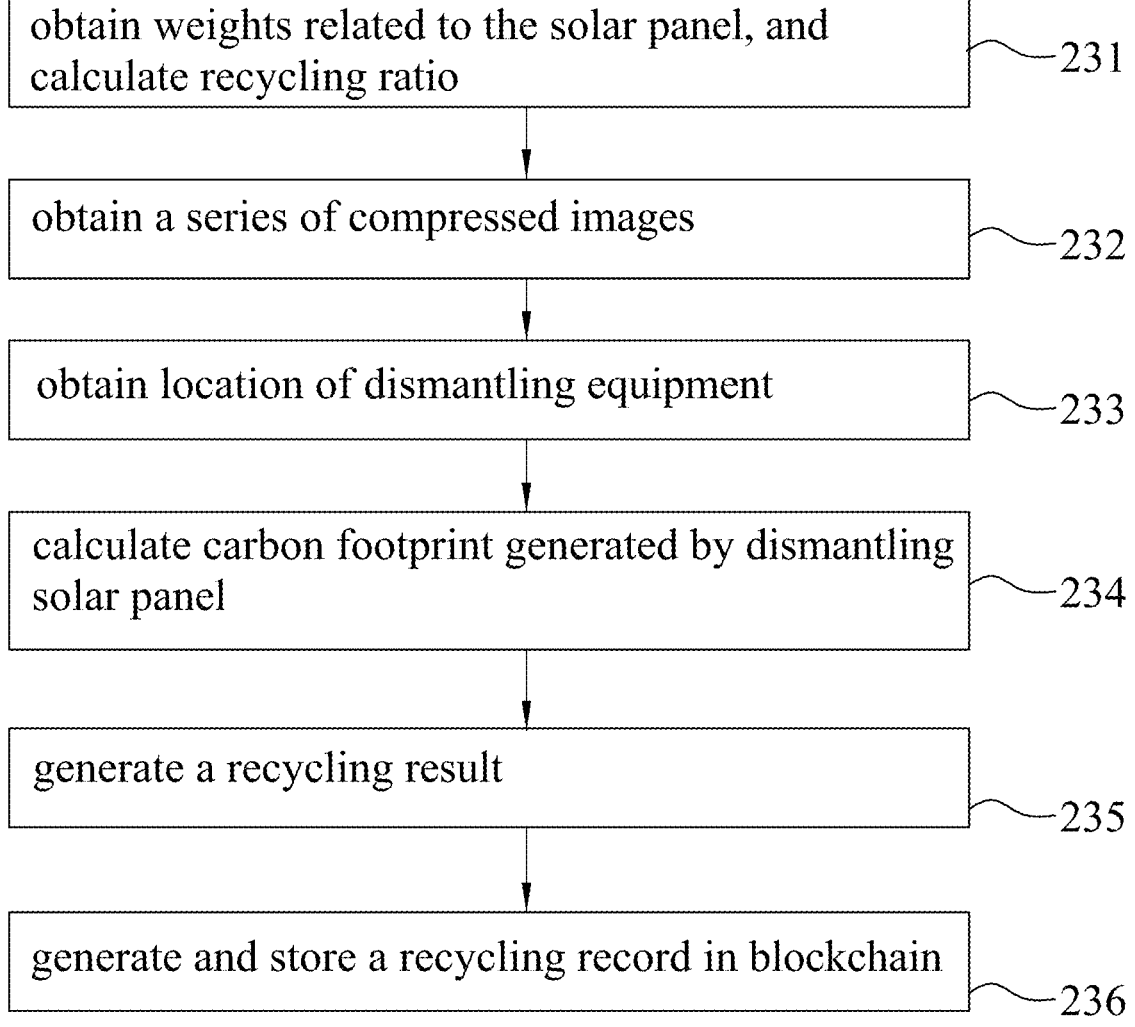
FIG. 4 is a flow chart illustrating sub-steps of obtaining and transmitting a recycling record to a target supplier end device according to an embodiment of the disclosure.

In this embodiment, the computer 3 automatically transmits the recycling record to the target supplier end device 4A once the recycling record is generated. In some embodiments, the computer 3 may be designed to transmit the recycling record to the target supplier end device 4A upon receiving a request from the target supplier end device 4A. Referring further to FIG. 4, step 23 includes sub-steps 231 to 236.

In sub-step 231, the computer 3 obtains: a weight of the junction box (hereinafter referred to as "junction box weight") based on the first weight and the second weight (i.e., subtracting the second weight from the first weight); a weight of the frame (hereinafter referred to as "frame weight") based on the third weight and the fourth weight (i.e., subtracting the fourth weight from the third weight); a weight of the back sheet (hereinafter referred to as "back sheet weight") based on the fifth weight and the sixth weight (i.e., subtracting the sixth weight from the fifth weight); a weight of the adhesive layer and the solar cell module (hereinafter referred to as "adhesive layer and solar cell module weight") based on the seventh weight and the eighth weight (i.e., subtracting the eighth weight from the seventh weight); and a weight of a front cover of the solar panel (hereinafter referred to as "front cover weight") based on the eighth weight (i.e., the front cover weight is equal to the eighth weight, which is the weight of the solar panel after removing the junction box, the frame, the back sheet, the adhesive layer and the solar cell module). It should be noted that the adhesive layer and solar cell module weight may also be calculated as a sum of the ninth weight and the tenth weight, instead of subtracting the eighth weight from the seventh weight.

The computer 3 further calculates a recycling ratio based on the first to tenth weights. To describe in further detail, the computer 3 calculates the recycling ratio based on the weight of the solar panel (i.e., the first weight), the junction box weight, the frame weight, the back sheet weight, the adhesive layer and solar cell module weight, and the front cover weight. Specifically, the recycling ratio is calculated by first calculating a sum of the junction box weight, the frame weight, the back sheet weight, the adhesive layer and solar cell module weight, and the front cover weight, and then calculating the sum divided by the weight of the solar panel to obtain the recycling ratio.

In sub-step 232, the computer 3 compresses a size of each of the first to eighth images, so as to obtain a series of compressed images that are related to the junction box, the frame, the back sheet, the adhesive layer and the solar cell module, and the front cover. That is to say, the series of compressed images record the process of dismantling the solar panel.

In sub-step 233, the computer 3 obtains a location of the dismantling equipment 1 based on an internet protocol (IP) address of the computer 3.

In sub-step 234, the computer 3 calculates an amount of carbon emissions generated by dismantling the solar panel based on the location and the power consumption. It should be noted that the amount of carbon emissions may be calculated in different manners based on the location. In some embodiments, the computer 3 may further obtain a power source of the dismantling equipment 1, and calculates the amount of carbon emissions based on the location, the power consumption, and the power source. The computer 3 may obtain the power source from inputs by the operator end device, but the disclosure is not limited to such.

In sub-step 235, the computer 3 generates the recycling result based on the dismantling data (or from inputs by the operator end device). To describe in further detail, the recycling result thus generated includes the recycling ratio, the junction box weight, the frame weight, the back sheet weight, the adhesive layer and solar cell module weight, the front cover weight, the series of compressed images, the power consumption, and the amount of carbon emissions.

In sub-step 236, the computer 3 generates and stores the recycling record that includes both of the product information and the recycling result as a block in the distributed ledger of the blockchain, and transmits the recycling record to the target supplier end device 4A.

In summary, according to the disclosure, the recycling system is capable of achieving the following effects: 1) the computer 3 obtains the recycling result based on the dismantling data, and stores the recycling record in the blockchain, as such, the process of dismantling the solar panel is properly recorded and cannot be tampered with; 2) the entire process of dismantling the solar panel is performed by the dismantling equipment 1, and the recycling record is automatically obtained and stored in the blockchain by the computer 3, which is completed entirely by machines without human participation, and as such, the recycling record has better credibility; 3) the recycling result includes images and weights that are related to the solar panel so that the process of dismantling the solar panel is clearly recorded, and the recycling result further includes the amount of carbon emissions so that the amount of greenhouse gases released during the process of dismantling the solar panel is recorded.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for generating a recycling record of a solar panel, the method implemented by a computer that is connected to a peer-to-peer network, that corresponds to a recycling operator, and that is electrically connected to a dismantling equipment, the dismantling equipment being configured to obtain information related to the solar panel and to dismantle the solar panel, the dismantling equipment including a weighing unit, a first removal device for removing a junction box of the solar panel, a second removal device for removing a frame of the solar panel, a third removal device for removing a back sheet of the solar panel, and a fourth removal device for removing an adhesive layer and a solar cell module of the solar panel, the method comprising:

upon the dismantling equipment receiving the solar panel that is provided with an information element, controlling the dismantling equipment to capture the information element, and obtaining product information related to the solar panel based on the information element;

controlling the dismantling equipment to dismantle the solar panel and to collect data of dismantling the solar panel;

obtaining a recycling result based on the data of dismantling the solar panel; and generating and storing a recycling record that includes the product information and the recycling result as a block in a distributed ledger of a blockchain managed by the peer-to-peer network, wherein the controlling of the dismantling equipment to dismantle the solar panel includes controlling the first removal device to remove the junction box of the solar panel, and controlling the weighing unit to detect a first weight before removing the junction box and a second weight after removing the junction box, controlling the second removal device to remove the frame of the solar panel, and controlling the weighing unit to detect a third weight before removing the frame and a fourth weight after removing the frame, controlling the third removal device to remove the back sheet of the solar panel, and controlling the weighing unit to detect a fifth weight before removing the back sheet and a sixth weight after removing the back sheet, and controlling the fourth removal device to remove the adhesive layer and the solar cell module of the solar panel together, and controlling the weighing unit to detect a seventh weight before removing the adhesive layer and the solar cell module, and an eighth weight after removing both of the adhesive layer and the solar cell module, and wherein the data of dismantling the solar panel includes the first to eighth weights.

2. The method as claimed in claim 1, the computer communicating, through a communication network, with a supplier end device that corresponds to a supplier who provides the solar panel, wherein:

the product information at least includes supplier end information that is related to the supplier of the solar panel; and the method further comprises transmitting the recycling record to the supplier end device based on the supplier end information that is related to the supplier.

3. The method as claimed in claim 1, the dismantling equipment further including a separating device for separating the adhesive layer and the solar cell module of the solar panel, wherein the controlling of the dismantling equipment to dismantle the solar panel further includes controlling the separating device to separate the adhesive layer from the solar cell module, and controlling the weighing unit to detect a ninth weight of the adhesive layer and a tenth weight of the solar cell module, and the data of dismantling the solar panel further includes the ninth weight and the tenth weight.

4. The method as claimed in claim 1, wherein in obtaining the recycling result, the computer calculates a recycling ratio based on the first to eighth weights, and obtains the recycling result to at least include the recycling ratio.

5. A method for generating a recycling record of a solar panel, the method implemented by a computer that is connected to a peer-to-peer network, that corresponds to a recycling operator, and that is electrically connected to a dismantling equipment, the dismantling equipment being configured to obtain information related to the solar panel and to dismantle the solar panel, the dismantling equipment including a power measurement device, the method comprising:

upon the dismantling equipment receiving the solar panel that is provided with an information element, controlling the dismantling equipment to capture the information element, and obtaining product information related to the solar panel based on the information element;

controlling the dismantling equipment to dismantle the solar panel and to collect data of dismantling the solar panel;

obtaining a recycling result based on the data of dismantling the solar panel; and generating and storing a recycling record that includes the product information and the recycling result as a block in a distributed ledger of a blockchain managed by the peer-to-peer network, wherein the controlling of the dismantling equipment to dismantle the solar panel includes controlling the power measurement device to detect a power consumption of dismantling the solar panel, and the data of dismantling the solar panel at least includes the power consumption.

6. The method as claimed in claim 5, wherein in obtaining the recycling result, the computer calculates an amount of carbon emissions generated by dismantling the solar panel based on a location of the dismantling equipment and the power consumption, and obtains the recycling result to at least include the power consumption and the amount of carbon emissions.

7. A recycling system for generating a recycling record of a solar panel, the recycling system adapted to recycle a solar panel that is provided with an information element, the recycling system comprising:

a dismantling equipment configured to obtain information related to the solar panel and to dismantle the solar panel; and a computer connected to a peer-to-peer network, and electrically connected to said dismantling equipment, said computer being configured to upon said dismantling equipment receiving the solar panel, control said dismantling equipment to capture the information element, and obtain product information related to the solar panel based on the information element, control said dismantling equipment to dismantle the solar panel and to collect data of dismantling the solar panel, obtain a recycling result based on the data of dismantling the solar panel, and generate and store a recycling record that includes the product information and the recycling result as a block in a distributed ledger of a blockchain managed by the peer-to-peer network, wherein said dismantling equipment includes a weighing unit, a first removal device for removing a junction box of the solar panel, a second removal device for removing a frame of the solar panel, a third removal device for removing a back sheet of the solar panel, and a fourth removal device for removing an adhesive layer and a solar cell module of the solar panel, and wherein said computer is further configured to control said first removal device to remove the junction box of the solar panel, and control said weighing unit to detect a first weight before removing the junction box and a second weight after removing the junction box, control said second removal device to remove the frame of the solar panel, and control said weighing unit to detect a third weight before removing the frame and a fourth weight after removing the frame, control said third removal device to remove the back sheet of the solar panel, and control said weighing unit to detect a fifth weight before removing the back sheet and a sixth weight after removing the back sheet, and control said fourth removal device to remove the adhesive layer and the solar cell module of the solar panel together, and control said weighing unit to detect a seventh weight before removing the adhesive layer and the solar cell module together, and an eighth weight after removing both of the adhesive layer and the solar cell module together, wherein the data of dismantling the solar panel includes the first to eighth weights.

8. The recycling system as claimed in claim 7, the recycling system communicating, through a communication network, with a supplier end device that corresponds to a supplier who provides the solar panel, wherein:

the product information at least includes supplier end information that is related to the supplier of the solar panel; and said computer is further configured to transmit the recycling record to the supplier end device based on the supplier end information that is related to the supplier.

9. The recycling system as claimed in claim 7, wherein:

said dismantling equipment further includes a separating device for separating the adhesive layer and the solar cell module of the solar panel; and said computer is further configured to control said separating device to separate the adhesive layer from the solar cell module, and control said weighing unit to detect a ninth weight of the adhesive layer and a tenth weight of the solar cell module, and the data of dismantling the solar panel further includes the ninth weight and the tenth weight.

10. The recycling system as claimed in claim 7, wherein said computer is further configured to calculate a recycling ratio based on the first to eighth weights, and to obtain the recycling result to at least include the recycling ratio.

11. A recycling system for generating a recycling record of a solar panel, the recycling system adapted to recycle a solar panel that is provided with an information element, the recycling system comprising:

a dismantling equipment configured to obtain information related to the solar panel and to dismantle the solar panel; and a computer connected to a peer-to-peer network, and electrically connected to said dismantling equipment, said computer being configured to upon said dismantling equipment receiving the solar panel, control said dismantling equipment to capture the information element, and obtain product information related to the solar panel based on the information element, control said dismantling equipment to dismantle the solar panel and to collect data of dismantling the solar panel, obtain a recycling result based on the data of dismantling the solar panel, and generate and store a recycling record that includes the product information and the recycling result as a block in a distributed ledger of a blockchain managed by the peer-to-peer network, wherein said dismantling equipment includes a power measurement device, and wherein said computer is further configured to control said power measurement device to detect a power consumption of dismantling the solar panel, and the data of dismantling the solar panel at least includes the power consumption.

12. The recycling system as claimed in claim 11, wherein said computer is further configured to calculate an amount of carbon emissions generated by dismantling the solar panel based on a location of said dismantling equipment and the power consumption, and to obtain the recycling result to at least include the power consumption and the amount of carbon emissions.

* * * * *